(12) United States Patent
Hanamaki et al.

(10) Patent No.: US 7,539,225 B2
(45) Date of Patent: May 26, 2009

(54) SEMICONDUCTOR LASER

(75) Inventors: Yoshihiko Hanamaki, Tokyo (JP);
Kenichi Ono, Tokyo (JP)

(73) Assignee: Mitsubishi Denki Kabushiki Kaisha,
Tokyo (JP)

( * ) Notice: Subject to any disclaimer, the term of this patent is extended or adjusted under 35 U.S.C. 154(b) by 140 days.

(21) Appl. No.: 11/258,053

(22) Filed: Oct. 26, 2005

(65) Prior Publication Data
US 2006/0176923 A1 Aug. 10, 2006

(30) Foreign Application Priority Data
Feb. 9, 2005 (JP) .............................. 2005-032668

(51) Int. Cl.
*H01S 3/04* (2006.01)
*H01S 3/14* (2006.01)
(52) U.S. Cl. ...................................... 372/43.01; 372/39
(58) Field of Classification Search ................ 372/43.01
See application file for complete search history.

(56) References Cited
U.S. PATENT DOCUMENTS

| 4,799,228 | A | 1/1989 | Nagasaka et al. | |
|---|---|---|---|---|
| 5,164,329 | A | 11/1992 | Moyer et al. | |
| 5,719,894 | A | 2/1998 | Jewell et al. | |
| 6,206,962 | B1 * | 3/2001 | Kijima et al. | 117/108 |
| 6,278,720 | B1 * | 8/2001 | Lee et al. | 372/46.01 |
| 7,016,385 | B2 * | 3/2006 | Watanabe | 372/44.01 |
| 7,259,406 | B2 * | 8/2007 | Hanamaki et al. | 257/103 |
| 2002/0044582 | A1 | 4/2002 | Kondo | |
| 2002/0122447 | A1 * | 9/2002 | Fukunaga et al. | 372/43 |
| 2003/0128731 | A1 * | 7/2003 | Fukunaga | 372/46 |
| 2003/0146444 | A1 * | 8/2003 | Onishi | 257/85 |

FOREIGN PATENT DOCUMENTS

JP            05-13879           1/1993

OTHER PUBLICATIONS

K. Uppal et al., "Strain effects on InGaP-InGaAsP-GaAsP Tensile Strained Quantum-Well Lasers", IEEE Photonics Technology Letters, vol. 7, No. 10, Oct. 1995 pp. 1128-1130.
J. Sebastian et al. "High-Power 810-nm GaAsP-AlGaAS Diode Lasers With Narrow Beam Divergence", IEEE Journal on Selected Topics in Quantum Electronics, vol. 7, No., Mar./Apr. 2001 pp. 334-339.

* cited by examiner

*Primary Examiner*—Minsun Harvey
*Assistant Examiner*—Phillip Nguyen
(74) *Attorney, Agent, or Firm*—Leydig, Voit & Mayer, Ltd.

(57) ABSTRACT

In a semiconductor laser, a n-type AlGaInP clad layer is formed on a n-type GaAs substrate and an active layer having an emission wavelength of 600 to 850 nm is formed on the n-type AlGaInP clad layer. A p-type AlGaInP clad layer is formed on the active layer and a p-type AlGaAs contact layer in which the Al composition is controlled so that the p-type AlGaAs contact layer has an optical bandgap larger than that of the active layer is formed on the p-type AlGaInP clad layer. A p-type GaAs cap layer is formed on the p-type AlGaAs contact layer.

7 Claims, 4 Drawing Sheets

Fig. 1

| No. | layer name | material | impurity | carrier concentration (E18/cm$^3$) | thickness (nm) |
|---|---|---|---|---|---|
| 9 | p-type cap layer | GaAs | C | 30.0–50.0 | 1–3 |
| 8 | p-type contact layer | AlGaAs* | C | 30.0–50.0 | 100–500 |
| 7 | p-type clad layer | AlGaInP | Zn or Mg | 1.0–2.0 | 500–1500 |
| 6 | guide layer | — | — | — | 500–1500 |
| 5 | active layer | — | — | — | 5–12 |
| 4 | guide layer | — | — | — | 500–1500 |
| 3 | n-type clad layer | AlGaInP | Si | 0.5–1.5 | 500–1500 |
| 2 | n-type buffer layer | GaAs | Si | 0.5–1.5 | 200–700 |
| 1 | n-type sub. | GaAs | Si | 0.7–1.0 | |

* Al composition is controlled so that p-type contact layer has an optical bandgap larger than that of active layer.

Fig. 2

| Al comp. | optical bandgap (Eg) | in wavelength (nm) | Al comp. | optical bandgap (Eg) | in wavelength (nm) |
|---|---|---|---|---|---|
| 0.03 | 1.4530042 | 853.27 | 0.24 | 1.7061088 | 726.68 |
| 0.04 | 1.4641808 | 846.75 | 0.25 | 1.719125 | 721.18 |
| 0.05 | 1.475445 | 840.29 | 0.26 | 1.7322288 | 715.73 |
| 0.06 | 1.4867968 | 833.87 | 0.27 | 1.7454202 | 710.32 |
| 0.07 | 1.4982362 | 827.51 | 0.28 | 1.7586992 | 704.95 |
| 0.08 | 1.5097632 | 821.19 | 0.29 | 1.7720658 | 699.64 |
| 0.09 | 1.5213778 | 814.92 | 0.30 | 1.78552 | 694.36 |
| 0.10 | 1.53308 | 808.70 | 0.31 | 1.7990618 | 689.14 |
| 0.11 | 1.5448698 | 802.53 | 0.32 | 1.8126912 | 683.96 |
| 0.12 | 1.5567472 | 796.40 | 0.33 | 1.8264082 | 678.82 |
| 0.13 | 1.5687122 | 790.33 | 0.34 | 1.8402128 | 673.73 |
| 0.14 | 1.5807648 | 784.30 | 0.35 | 1.854105 | 668.68 |
| 0.15 | 1.592905 | 778.33 | 0.36 | 1.8680848 | 663.67 |
| 0.16 | 1.6051328 | 772.40 | 0.37 | 1.8821522 | 658.71 |
| 0.17 | 1.6174482 | 766.52 | 0.38 | 1.8963072 | 653.80 |
| 0.18 | 1.6298512 | 760.68 | 0.39 | 1.9105498 | 648.92 |
| 0.19 | 1.6423418 | 754.90 | 0.40 | 1.92488 | 644.09 |
| 0.20 | 1.65492 | 749.16 | 0.41 | 1.9392978 | 639.30 |
| 0.21 | 1.6675858 | 743.47 | 0.42 | 1.9538032 | 634.56 |
| 0.22 | 1.6803392 | 737.83 | 0.43 | 1.9683962 | 629.85 |
| 0.23 | 1.6931802 | 732.23 | | | |

Fig. 5

Background Art

| No. | layer name | material | impurity | carrier concentration (E18/cm³) | thickness (nm) |
|---|---|---|---|---|---|
| 29 | p-type contact layer | GaAs | Zn | 10.0–30.0 | 100–500 |
| 28 | p-type BDR layer | InGaP | Zn | 1.0–3.0 | 20–100 |
| 27 | p-type clad layer | AlGaInP | Zn | 1.0–2.0 | 500–1500 |
| 26 | guide layer | InGaP | — | — | 500–1500 |
| 25 | active layer | GaAsP | — | — | 5–12 |
| 24 | guide layer | InGaP | — | — | 500–1500 |
| 23 | n-type clad layer | AlGaInP | Si | 0.5–1.5 | 500–1500 |
| 22 | n-type buffer layer | GaAs | Si | 0.5–1.5 | 200–700 |
| 21 | n-type sub. | GaAs | Si | 0.7–1.0 | |

SEMICONDUCTOR LASER

FIELD OF THE INVENTION

The present invention relates to an end-surface emission type of semiconductor laser.

DESCRIPTION OF THE BACKGROUND ART

There has been a semiconductor laser having a GaAs contact layer to which Zn is added (see, for example, Jurgen Sebastian et al., "High-Power 810-nm GaAsP-AlGaAs Diode Lasers with Narrow Beam Divergence", IEEE JOURNAL ON SELECTED TOPICS IN QUANTUM ELECTRONICS, VOL. 7, NO. 2, March/April 2001, P. 334-339).

An example of a laminated structure of a semiconductor laser having a GaAs contact layer to which Zn is added will be described with reference to FIG. 5.

As shown in FIG. 5, a n-type GaAs buffer layer 22 to which Si is added as a n-type impurity is formed on a n-type GaAs substrate 21. A n-type AlGaInP clad layer 23 to which Si is added is formed on the n-type GaAs buffer layer 22. A quantum-well structure formed of a non-doped InGaP guide layer 24, a non-doped GaAsP active layer 25 and a non-doped InGaP guide layer 26 is formed on the n-type AlGaInP clad layer 23. A p-type AlGaInP clad layer 27 to which Zn is added as a p-type impurity, a p-type InGaP-BDR (band discontinuity reduction) layer 28 to which Zn is added and a p-type GaAs contact layer 29 to which Zn is added are successively formed on the quantum-well structure. The film thickness and carrier concentration of each layer are shown in FIG. 5.

As a method of measuring the emission wavelength of a active layer of semiconductor laser, photoluminescence (hereinafter referred to as "PL") measurement is known.

In ordinary cases, however, the optical bandgap of a contact layer of a semiconductor laser is smaller than the optical bandgap of an active layer. Also in the above-described semiconductor laser, the optical bandgap of the p-type GaAs contact layer 29 is smaller than the optical bandgap of the GaAsP active layer 25. Therefore, if a PL measurement is carried out on the semiconductor laser in the normal state, light is absorbed by the contact layer 29, so that the active layer 25 cannot be photoexcited. Therefore, removal of the contact layer 29 is required to enable photoexcitation of the active layer 25 in PL measurement. That is, a destructive test is required for measurement of the emission wavelength of the active layer.

Thus, PL measurements on the conventional semiconductor lasers have been destructive tests, and PL measurements cannot be made on active layers in products. PL measurements have therefore been made on active layers formed on test wafers. However, the results of PL measurements on active layers on test wafers are not always the same as the PL wavelengths of the corresponding active layers in products. For this reason, defective/nondefective determination with respect to the emission wavelength of a product cannot be made before the completion of an energization test on the product. In some case, the yield of a product is reduced due to this hindrance.

SUMMARY OF THE INVENTION

The present invention has been conceived to solve the previously-mentioned problems and a general object of the present invention is to provide a novel and useful semiconductor laser.

A more specific object of the present invention is to provide a semiconductor laser capable of execution of a PL measurement on the active layer without using a test wafer.

According to one aspect of the present invention, the semiconductor laser comprises a first clad layer formed over a semiconductor substrate. An active layer is formed on the first clad layer and has an emission wavelength of 600 to 850 nm. A second clad layer is formed on the active layer. A contact layer is formed on the second clad layer and formed of an AlGaAs layer. An Al composition in the contact layer is controlled so that the contact layer has an optical bandgap larger than that of the active layer.

Other objects and further features of the present invention will be apparent from the following detailed description when read in conjunction with the accompanying drawings.

BRIEF DESCRIPTION OF THE DRAWINGS

FIG. 1 is a sectional view for describing a semiconductor device according to a first embodiment of the present invention;

FIG. 2 is a diagram showing the correlation between the Al composition and the optical bandgap in an AlGaAs contact layer shown in FIG. 1;

FIG. 5 is a diagram showing a laminated structure of a semiconductor laser having a GaAs contact layer to which Zn is added.

DETAILED DESCRIPTION OF THE PREFERRED EMBODIMENTS

Figure 3:
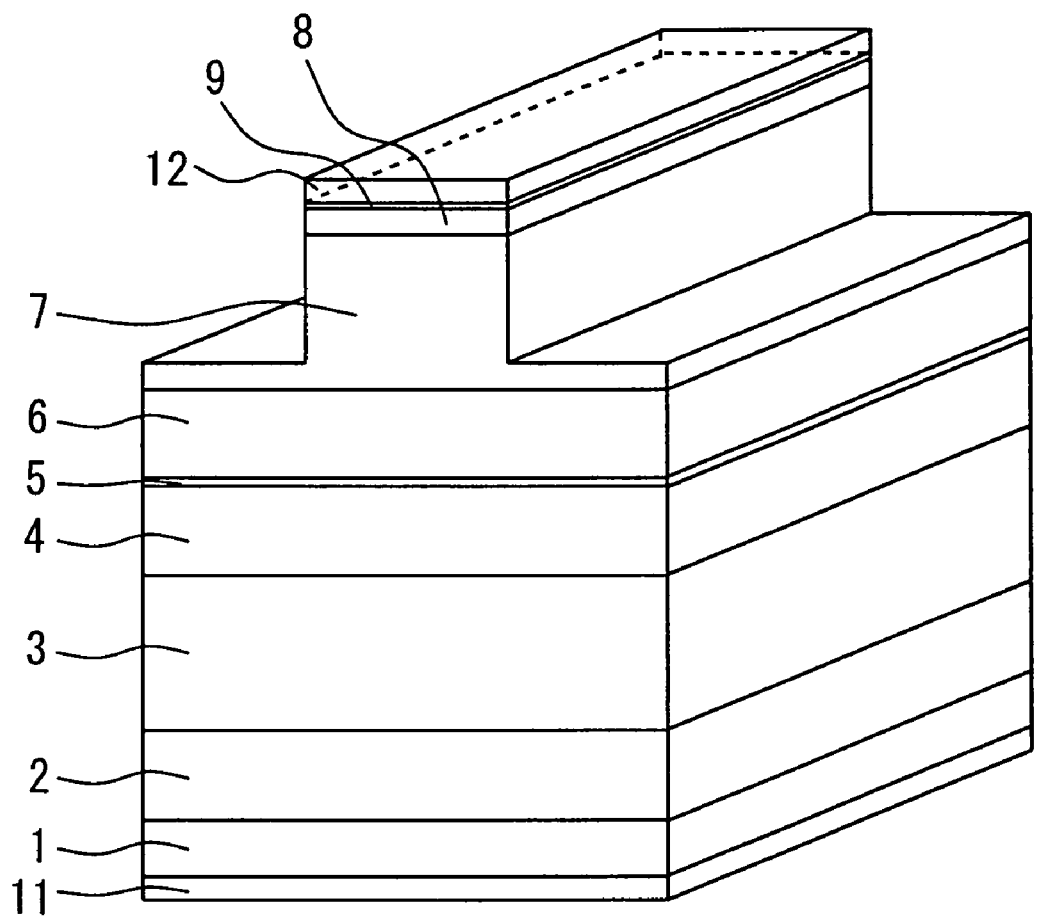
FIG. 3 is a diagram showing a ridge waveguide type of semiconductor laser to which the device structure shown in FIG. 1 is applied.

In the following, principles and embodiments of the present invention will be described with reference to the accompanying drawings. The members and steps that are common to some of the drawings are given the same reference numerals and redundant descriptions therefore may be omitted.

Figure 4:
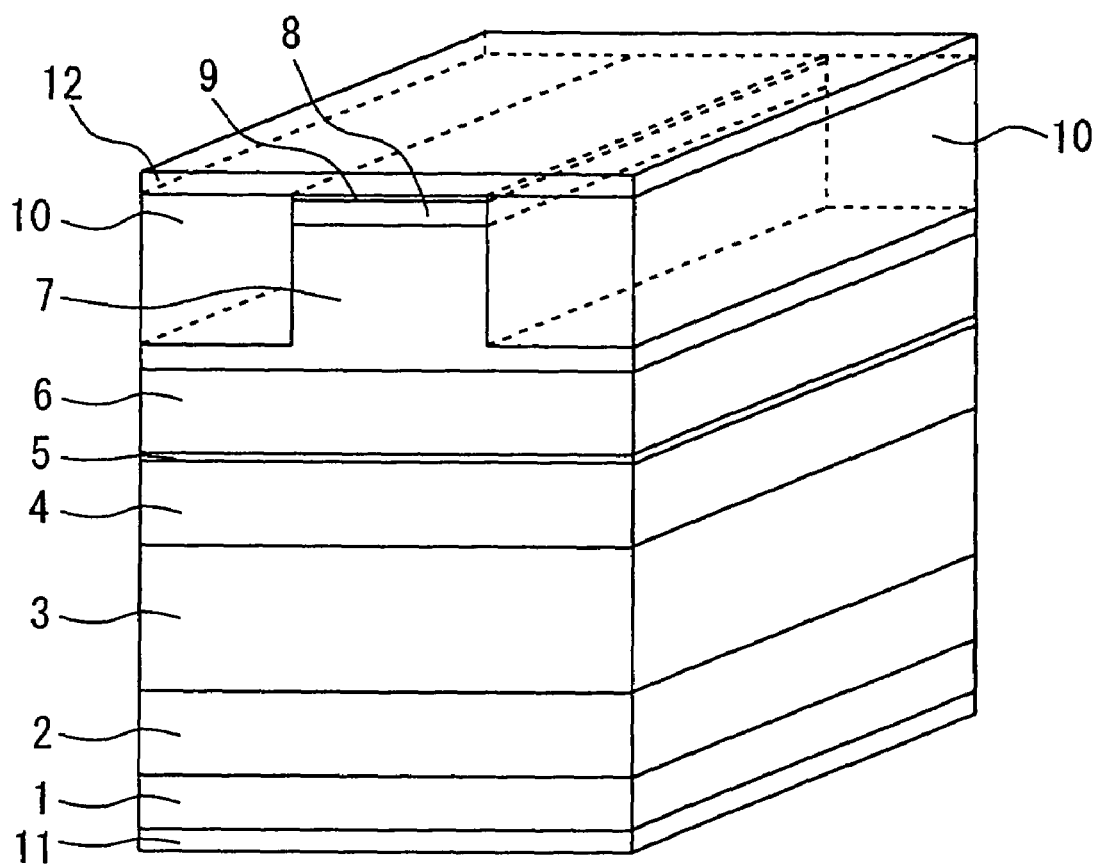
FIG. 4 is a diagram showing a buried ridge type of semiconductor laser to which the device structure shown in FIG. 1 is applied, and which has a current-constriction structure.

FIG. 1 is a diagram showing a device structure of a semiconductor laser according to an embodiment of the present invention. FIG. 2 is a diagram showing the correlation between the Al composition and the optical bandgap in an AlGaAs contact layer shown in FIG. 1. FIG. 3 is a diagram showing a ridge waveguide type of semiconductor laser to which the device structure shown in FIG. 1 is applied. FIG. 4 is a diagram showing a buried ridge type of semiconductor laser to which the device structure shown in FIG. 1 is applied, and which has a current-constriction structure.

As shown in FIGS. 1, 3, and 4, a n-type buffer layer 2 is formed on a semiconductor substrate 1, which is a n-type GaAs substrate. The n-type buffer layer 2 is formed of a n-type GaAs layer and has a film thickness of 200 to 700 nm for example. A n-type clad layer 3 is formed as a first clad layer on the n-type buffer layer 2. The n-type clad layer 3 is formed of a n-type AlGaInP layer and has a film thickness of 500 to 1500 nm for example. Si is added as a n-type impurity to each of the semiconductor substrate 1, the n-type buffer layer 2 and the n-type clad layer 3. The carrier concentration in the semiconductor substrate 1 is $0.7 \times 10^{18}$ to $1.0 \times 10^{18}$ (/cm$^3$). In each of the n-type buffer layer 2 and the n-type clad layer 3, the carrier concentration is $0.5 \times 10^{18}$ to $1.5 \times 10^{18}$ (/cm$^3$).

As shown in FIGS. 3 and 4, a n-type lower electrode 11 is formed on the back surface of the n-type GaAs substrate 1. For example, the n-type lower electrode 11 is formed by laminating an Au—Ge alloy film and an Au film.

A quantum-well structure formed by laminating a non-doped guide layer 4, a non-doped active layer 5 and a non-doped guide layer 6 is formed on the n-type clad layer 3. For example, the quantum-well structure is constituted by an InGaAsP layer serving as the guide layer 4, a GaAsP layer serving as the active layer 5, and an InGaAsP layer serving as the guide layer 6. This quantum-well structure has an optical band gap of 790 to 810 nm in terms of wavelength. That is, the emission wavelength of this quantum-well structure is 790 to 810 nm. The optical bandgap of the active layer 5 is smaller than those of the guide layers 4 and 6. Therefore, the emission wavelength of the active layer 5 corresponds to the emission wavelength of the quantum-well structure. The film thickness of the active layer 5 is, for example, 5 to 12 nm, and the film thicknesses of the guide layers 4 and 6 are, for example, 500 to 1500 nm.

A p-type clad layer 7 is formed as a second clad layer on the quantum-well structure. The p-type clad layer 7 is formed of a p-type AlGaInP layer and has a film thickness of 500 to 1500 nm for example. Zn or Mg is added as a p-type impurity to the p-type clad layer 7. The carrier concentration in the p-type clad layer 7 is $1.0 \times 10^{18}$ to $2.0 \times 10^{18}$ (/cm$^3$).

A p-type contact layer 8 is formed on the p-type clad layer 7. The p-type contact layer 8 is formed of a p-type $Al_xGa_{1-x}As_y$ layer to which C is added as a p-type impurity. The Al composition x in the p-type AlGaAs contact layer 8 is controlled so that the p-type AlGaAs contact layer 8 has an optical bandgap larger than that of the above-described quantum-well structure. As shown in FIG. 2, the optical bandgap of the p-type AlGaAs contact layer 8 can be controlled by controlling the Al composition. Since the optical bandgap of the GaAsP active layer 5 is 790 to 810 nm in terms of wavelength as mentioned above, the Al composition x is controlled to be 0.124 or more according to the relationship shown in FIG. 2. The p-type AlGaAs contact layer 8 has a film thickness of 100 to 500 nm for example. The carrier concentration in the p-type contact layer 8 is $30.0 \times 10^{18}$ to $50.0 \times 10^{18}$ (/cm$^3$).

A p-type cap layer 9 is formed on the p-type contact layer 8. The p-type cap layer 9 is formed of p-type GaAs layer to which C is added. The p-type cap layer 9 is a protective layer for preventing worsening of the current flow through p-type contact layer 8 caused by oxidation. The film thickness of the p-type cap layer 9 is, for example, 1 to 3 nm and preferably 2 nm. If the film thickness is larger than this value, an undesirable phenomenon such as absorption of excitation light entering the active layer 5 at the time of PL measurement or PL light emitted from the active layer 5 occurs.

In the ridge-waveguide-type semiconductor laser shown in FIG. 3, a p-type upper electrode 12 is formed on the p-type cap layer 9.

In the buried-ridge-type semiconductor laser shown in FIG. 4, a n-type current block layer 10 is formed on opposite sides of a ridge portion constituted by the p-type clad layer 7, the p-type contact layer 8 and the p-type cap layer 9. The n-type current block layer 10 is formed of a n-type AlInP layer and is provided for current constriction. A p-type top electrode 12 is formed on the n-type current block layer 10 and the p-type cap layer 9.

The p-type top electrode 12 is formed, for example, by laminating a Ti film and an Au film.

Next, a method of fabricating the semiconductor laser will be described.

For formation of each of the layers of the above-described semiconductor laser (i.e., the n-type buffer layer 2, the n-type clad layer 3, the guide layer 4, the active layer 5, the guide layer 6, the p-type clad layer 7, the p-type contact layer 8 and the p-type cap layer 9), a metal organic chemical vapor deposition (MOCVD) method for example can be used. The growth temperature is, for example, 720° C., and the growth pressure is, for example, 100 mbar. As raw materials gas for forming each layer, some of trimethyl indium (TMI), trimethyl gallium (TMG), trimethyl aluminum (TMA), phosphine (PH$_3$), arsine (AsH$_3$), silane (SiH$_4$), cyclopentadienyl magnesium (Cp$_2$Mg), dimethyl zinc (DMZn) or diethyl zinc (DEZn) for example are used. The flow rates of such raw material gases are controlled by using a mass flow controller to obtain the desired composition in each layer. The optical bandgap of the p-type AlGaAs contact layer 8 is increased relative to that of the active layer 5 by controlling the Al composition in the p-type AlGaAs contact layer 8, as described above.

In ordinarily cases of the growth of AlGaAs and GaAs layers, the growth temperature is about 600 to 700° C., and the ratio of the flow rate of arsine to the ratio of the flow rate of trimethyl gallium (hereinafter referred to as "V/III ratio") is about several tens to several hundreds. In this embodiment, the growth temperature at the time of growth of each of the p-type AlGaAs contact layer 8 and the p-type GaAs cap layer 9 to which C is added as an impurity is set to 540° C. for example, and the V/III ratio for these layers is set to about 1. In this case, there is no need to add a special raw-material gas for addition of an impurity, while C liberated from the methyl group of trimethyl gallium is taken into the p-type contact layer 8 and the p-type cap layer 9. This method is known as an intrinsic impurity introduction method.

C may be added to the p-type contact layer 8 and the p-type cap layer 9 by adding carbon tetrachloride (CCl$_4$) or carbon tetrabromide (CBr$_4$) as a raw material gas instead of using the intrinsic impurity introduction method.

Subsequently, a resist pattern for covering a portion to be the ridge portion is formed by using a lithography technique. The p-type cap layer 9 and the p-type contact layer 8 and the p-type clad layer 7 are dry-etched by using the resist pattern as a mask. An endpoint of dry etching is set such as to leave a portion of the p-type clad layer 7 having a predetermined film thickness. After the completion of dry etching, the resist pattern is removed. The ridge portion in stripe form is thereby formed (see FIGS. 3 and 4).

Thereafter, the n-type lower electrode 11 is formed on the back surface of the substrate 1 by vapor deposition or sputtering. The p-type upper electrode 12 is formed on the p-type cap layer 9 by vapor deposition or sputtering. The ridge-waveguide-type semiconductor laser shown in FIG. 3 is thereby obtained.

On the other hand, the n-type AlInP layer is formed over the ridge portion and etching-back is then performed to form the current block layers 10 on the opposite sides of the ridge portion. Thereafter, the n-type lower electrode 11 is formed on the back surface of the substrate 1 by vapor deposition or sputtering. The p-type upper electrode 12 is formed on the n-type current block layer 10 and the p-type cap layer 9 by vapor deposition or sputtering. The buried-ridge-type semiconductor laser shown in FIG. 4 is thereby obtained.

In this embodiment, as described above, in the semiconductor laser having an emission wavelength in the 790-810 nm band, the Al composition in the p-type AlGaAs contact layer 8 is controlled so that the optical bandgap of the p-type AlGaAs contact layer 8 is larger than that of the active layer 5. Absorption of light by the p-type AlGaAs contact layer 8 can be prevented at the time of photoexcitation of the active layer 5 in PL measurement. Thus, the active layer 5 can be photoexcited even if the p-type AlGaAs contact layer 8 is not removed. That is, a PL measurement can be made by means of a non-destructive test. Consequently, a PL measurement can be executed on the active layer of the semiconductor laser on the product wafer without using a test wafer, thus achieving an improvement in total yield of the product.

In this embodiment, the p-type GaAs cap layer 9 is formed on the p-type AlGaAs contact layer 8. Oxidation of the p-type AlGaAs contact layer 8 is thereby prevented. As a result, a good current flow characteristic of the p-type AlGaAs contact layer 8 can be obtained.

This embodiment has been described with respect to a semiconductor laser having an emission wavelength in the 790-810 nm band. However, the present invention can be applied to any semiconductor laser if the semiconductor laser has an emission wavelength in the 600-850 nm band. That is, while the quantum-well structure in this embodiment is constituted by InGaAsP guide layer 4/GaAsP active layer 5/InGaAsP guide layer 6, the combination of materials is not limited to this if the quantum-well structure has the above-described emission wavelength. For example, as a combination of materials constituting the quantum-well structure, InGaP layer/GaAsP layer/InGaP layer, InGaAsP layer/InGaAsP layer/InGaAsP layer, InGaP layer/InGaAsP layer/InGaP layer, or AlGaAs layer/AlGaAs layer/AlGaAs layer may be used. In the case of use of the quantum-well structure having any of such combinations, the same effect as that of the above-described embodiment can be obtained by controlling the Al composition in the p-type AlGaAs contact layer 8 on the basis of the relationship shown in FIG. 2 so that the optical bandgap of the contact layer 8 is larger than that of the active layer 5.

While C is added as a p-type impurity to the p-type contact layer 8 and the p-type cap layer 9 in the above-described embodiment, the same effect as that of the above-described embodiment can also be obtained in the case of adding Zn or Mg in place of C.

While only one active layer 5 is provided in the above-described embodiment, a plurality of active layers 5 may alternatively be formed. Also in such a case, the same effect as that of the above-described embodiment can also be obtained.

While AlGaInP is used as the material of the clad layer in the above-described embodiment, the same effect as that of the above-described embodiment can also be obtained in the case of using AlGaAs in place of AlGaInP.

This invention, when practiced illustratively in the manner described above, provides the following major effects:

According to the present invention, the Al composition in the AlGaAs contact layer is controlled so that the optical bandgap of the AlGaAs contact layer is larger than that of the active layer, thereby enabling photoexcitation of the active layer without removing the contact layer. Therefore, a PL measurement on the active layer of the semiconductor laser can be made without using a test wafer.

Further, the present invention is not limited to these embodiments, but variations and modifications may be made without departing from the scope of the present invention.

The entire disclosure of Japanese Patent Application No. 2005-32668 filed on Feb. 9, 2005 containing specification, claims, drawings and summary are incorporated herein by reference in its entirety.

What is claimed is:

1. An AlGaInP semiconductor laser comprising:
   an AlGaInP first cladding layer supported by a semiconductor substrate;
   an active layer on the first cladding layer and having an emission wavelength of 600 to 850 nm;
   an AlGaInP second cladding layer on the active layer;
   an AlGaAs contact layer on the second cladding layer and having an Al composition so that the contact layer has an optical bandgap larger than the optical bandgap of the active layer;
   a GaAs cap layer on the AlGaAs contact layer and having a thickness not exceeding 3 nm; and
   an electrode on and in contact with the GaAs cap layer.

2. The semiconductor laser according to claim 1, wherein the optical bandgap of the active layer is 790 to 850 nm, and the Al composition of the contact layer is at least 0.124.

3. The semiconductor laser according to claim 1, further comprising:
   a first guide layer between the active layer and the first cladding layer; and
   a second guide layer between the active layer and the second cladding layer, wherein the first guide layer, the active layer, and the second guide layer are an InGaAsP layer, a GaAsP layer, and an InGaAsP layer, respectively, and constitute a quantum-well structure.

4. The semiconductor laser according to claim 1, further comprising:
   a first guide layer between the active layer and the first cladding layer; and
   a second guide layer between the active layer and the second cladding layer, wherein the first guide layer, the active layer, and the second guide layer are an InGaP layer, a GaAsP layer, and an InGaP layer, respectively, and constitute a quantum-well structure.

5. The semiconductor laser according to claim 1, further comprising:
   a first guide layer between the active layer and the first cladding layer; and
   a second guide layer between the active layer and the second cladding layer, wherein the first guide layer, the active layer, and the second guide layer are an InGaAsP layer, an InGaAsP layer, and an InGaAsP layer, respectively, and constitute a quantum-well structure.

6. The semiconductor laser according to claim 1, further comprising:
   a first guide layer between the active layer and the first cladding layer; and
   a second guide layer between the active layer and the second cladding layer, wherein the first guide layer, the active layer, and the second guide layer are an InGaP layer, an InGaAsP layer, and an InGaP layer, respectively, and constitute a quantum-well structure.

7. The semiconductor laser according to claim 1, further comprising:
   a first guide layer between the active layer and the first cladding layer; and
   a second guide layer between the active layer and the second cladding layer, wherein the first guide layer, the active layer, and the second guide layer are an AlGaAs layer, an AlGaAs layer, and an AlGaAs layer, respectively, and constitute a quantum-well structure.

* * * * *